(12) United States Patent
Yoshida

(10) Patent No.: US 9,011,632 B2
(45) Date of Patent: Apr. 21, 2015

(54) SUPPORT DISK FIXING APPARATUS, MANUFACTURING METHOD FOR A SEMICONDUCTOR DEVICE USING THIS APPARATUS, AND SEMICONDUCTOR MANUFACTURING APPARATUS

(71) Applicant: Taichi Yoshida, Toyota (JP)

(72) Inventor: Taichi Yoshida, Toyota (JP)

(73) Assignee: Toyota Jidosha Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/058,630

(22) Filed: Oct. 21, 2013

(65) Prior Publication Data

US 2014/0127881 A1 May 8, 2014

(30) Foreign Application Priority Data

Nov. 2, 2012 (JP) ................................ 2012-243024

(51) Int. Cl.
- *H01L 21/306* (2006.01)
- *H01L 21/683* (2006.01)
- *H01L 21/762* (2006.01)
- *H01L 21/673* (2006.01)

(52) U.S. Cl.
CPC ...... *H01L 21/6835* (2013.01); *H01L 21/76256* (2013.01); *H01L 2221/68327* (2013.01); *H01L 21/67346* (2013.01)

(58) Field of Classification Search
CPC .............................. H01L 21/762; H01L 21/683
USPC ..................... 438/459; 156/345; 269/55, 309; 414/217
See application file for complete search history.

(56) References Cited

U.S. PATENT DOCUMENTS

| | | | | |
|---|---|---|---|---|
| 7,525,787 B2* | 4/2009 | Dhindsa et al. | ............... | 361/234 |
| 2003/0066604 A1* | 4/2003 | Franklin et al. | ........... | 156/345.12 |
| 2003/0180127 A1* | 9/2003 | Kuroda | ........................ | 414/217 |
| 2004/0178553 A1* | 9/2004 | Camm et al. | .................... | 269/55 |
| 2005/0009299 A1* | 1/2005 | Wada et al. | .................... | 438/459 |
| 2005/0221584 A1* | 10/2005 | Arai | ............................. | 438/458 |
| 2005/0232726 A1* | 10/2005 | Murrell | ......................... | 414/217 |
| 2006/0120832 A1* | 6/2006 | Chhibber et al. | ............. | 414/217 |
| 2006/0267009 A1* | 11/2006 | Portune | ........................... | 257/48 |
| 2007/0292814 A1* | 12/2007 | Sasajima et al. | ................... | 432/5 |
| 2008/0037195 A1* | 2/2008 | Himori et al. | ................. | 361/234 |
| 2008/0179285 A1* | 7/2008 | Li et al. | ........................... | 216/63 |
| 2008/0295962 A1* | 12/2008 | Endo et al. | .............. | 156/345.23 |
| 2009/0075012 A1* | 3/2009 | Van Dijk et al. | ............. | 428/64.4 |
| 2009/0230636 A1* | 9/2009 | Goto | ............................. | 279/128 |
| 2010/0014208 A1* | 1/2010 | Tatsuhiko et al. | ............ | 361/234 |

(Continued)

FOREIGN PATENT DOCUMENTS

| | | |
|---|---|---|
| JP | A-2006-186224 | 7/2006 |
| JP | A-2006-228802 | 8/2006 |

(Continued)

*Primary Examiner* — Caleb Henry
(74) *Attorney, Agent, or Firm* — Oliff PLC

(57) ABSTRACT

A support disk fixing apparatus which includes an upper surface to which a wafer is bonded, a lower surface, a cylindrical side surface between the upper surface and the lower surface, and a chamfered portion between the upper surface and the side surface, includes a base upon which the support disk is placed; and a fixture that is provided on the base, and that has a first surface that abuts against the side surface of the support disk and covers the side surface of the support disk, and a second surface that abuts against the chamfered portion of the support disk and covers the chamfered portion of the support disk.

4 Claims, 7 Drawing Sheets

(56) References Cited

U.S. PATENT DOCUMENTS

| | | | |
|---|---|---|---|
| 2010/0025908 A1* | 2/2010 | Munakata | 269/57 |
| 2010/0029087 A1* | 2/2010 | Okita | 438/745 |
| 2010/0053841 A1* | 3/2010 | Rusinko et al. | 361/234 |
| 2010/0085582 A1* | 4/2010 | Weniger et al. | 356/621 |
| 2010/0096869 A1* | 4/2010 | Mantz | 294/86.4 |
| 2010/0110605 A1* | 5/2010 | Lee et al. | 361/234 |
| 2010/0162956 A1* | 7/2010 | Murakami et al. | 118/725 |
| 2010/0215461 A1* | 8/2010 | Kamikawa et al. | 414/222.13 |
| 2010/0226745 A1* | 9/2010 | Umehara et al. | 414/752.1 |
| 2010/0265631 A1* | 10/2010 | Stone et al. | 361/234 |
| 2010/0284770 A1* | 11/2010 | Yazawa et al. | 414/226.05 |
| 2011/0026187 A1* | 2/2011 | Reynolds | 361/234 |
| 2011/0233719 A1* | 9/2011 | Blanchard | 257/506 |
| 2012/0028439 A1* | 2/2012 | Zhang et al. | 438/459 |
| 2012/0039690 A1* | 2/2012 | Stangl et al. | 414/222.01 |
| 2012/0141235 A1* | 6/2012 | Krupyshev et al. | 414/217.1 |
| 2012/0164778 A1* | 6/2012 | Blanchard et al. | 438/66 |
| 2012/0289025 A1* | 11/2012 | Kato | 438/459 |
| 2012/0313332 A1* | 12/2012 | Jeon et al. | 279/3 |
| 2012/0315113 A1* | 12/2012 | Hiroki | 414/217 |
| 2013/0001899 A1* | 1/2013 | Hwang et al. | 279/128 |
| 2013/0048610 A1* | 2/2013 | Goodman et al. | 216/83 |
| 2013/0078061 A1* | 3/2013 | Enokida et al. | 414/226.05 |
| 2013/0120896 A1* | 5/2013 | Ono | 361/233 |
| 2013/0122431 A1* | 5/2013 | Angelov et al. | 430/319 |
| 2013/0134148 A1* | 5/2013 | Tachikawa et al. | 219/444.1 |

FOREIGN PATENT DOCUMENTS

| | | |
|---|---|---|
| JP | A-2009-16771 | 1/2009 |
| JP | A-2012-49274 | 3/2012 |

* cited by examiner

SUPPORT DISK FIXING APPARATUS, MANUFACTURING METHOD FOR A SEMICONDUCTOR DEVICE USING THIS APPARATUS, AND SEMICONDUCTOR MANUFACTURING APPARATUS

INCORPORATION BY REFERENCE

The disclosure of Japanese Patent Application No. 2012-243024 filed on Nov. 2, 2012 including the specification, drawings and abstract is incorporated herein by reference in its entirety.

BACKGROUND OF THE INVENTION

1. Field of the Invention

The invention relates to a support disk fixing apparatus, a manufacturing method for a semiconductor device using this apparatus, and a semiconductor manufacturing apparatus.

2. Description of Related Art

In recent years, wafers have continued to be made thinner and thinner. Therefore, when manufacturing a semiconductor device by processing a wafer, the wafer is bonded to a support disk to facilitate transfer and the like of the wafer. Japanese Patent Application Publication No. 2012-49274 (JP 2012-49274 A) describes a circular substrate support plate (a support disk). An arc-shaped groove (a concave overlapping limit mark) is formed along an outer peripheral edge portion of a wafer attaching surface of the substrate support plate. Therefore, when bonding the wafer to the substrate support plate, excess adhesive that flows out from the gap between the wafer and the substrate support plate flows into the arc-shaped groove. As a result, the excess adhesive is prevented from wrapping around a side surface of the substrate support plate, so adverse effects, such as the adhesive adhering to the device, are able to be prevented in a process performed after the wafer is bonded.

With the substrate support plate described in JP 2012-49274 A, the arc-shaped groove is formed along the outer peripheral edge portion of the wafer attaching surface. The wafer attaching surface is divided into a surface positioned farther toward the center than the arc-shaped groove, in a radial direction of the substrate support plate (hereinafter, this surface will be referred to as the "inner wafer attaching surface"), and a surface positioned farther toward the outside than the arc-shaped groove, in the radial direction of the substrate support plate (hereinafter, this surface will be referred to as the "outer wafer attaching surface").

The arc-shaped groove is formed such that a diameter of the inner wafer attaching surface is slightly larger than a diameter of the wafer. When bonding the wafer to the substrate support plate, the wafer is arranged such that the outer periphery of the wafer is to the inside of the outer periphery of the inner wafer attaching surface. When bonding the wafer to the substrate support plate, the inner wafer attaching surface is covered by either the wafer or excess adhesive. However, the amount of adhesive used to bond the wafer is an amount that is unable to flow beyond the groove and move from the inner wafer attaching surface to the outer wafer attaching surface. Therefore, the outer wafer attaching surface is not covered by either the wafer or excess adhesive after the wafer is bonded to the substrate support plate.

Therefore, when performing a wafer etching process after the wafer is bonded to the substrate support plate, the bare outer wafer attaching surface is etched, and the outer wafer attaching surface is damaged. As a result, the frequency with which the substrate support plate is replaced increases, so the production cost of the semiconductor device increases.

SUMMARY OF THE INVENTION

The invention thus provides technology capable of inhibiting a wafer attaching surface of a support disk from being etched.

A first aspect of the invention relates to a support disk fixing apparatus which includes an upper surface to which a wafer is bonded, a lower surface, a cylindrical side surface between the upper surface and the lower surface, and a chamfered portion between the upper surface and the side surface. This apparatus includes a base upon which the support disk is placed; and a fixture that is provided on the base, and that has a first surface that abuts against the side surface of the support disk and covers the side surface of the support disk, and a second surface that abuts against the chamfered portion of the support disk and covers the chamfered portion of the support disk.

A second aspect of the invention relates to a method for manufacturing a semiconductor device using the support disk fixing apparatus according to the first aspect described above. This method includes fixing the support disk to the base by abutting the first surface of the fixture against the side surface of the support disk, and abutting the second surface of the fixture against the chamfered portion of the support disk; bonding a wafer to the upper surface of the support disk using an adhesive; and etching the wafer bonded to the support disk with an etching solution.

A third aspect of the invention relates to a semiconductor manufacturing apparatus that includes a support disk formed in a circular cylindrical shape, the support disk having a chamfered portion that is formed between a top surface of the support disk and a side surface of the support disk; and a fixture that fixes the support disk, the fixture having a first surface that abuts against the side surface of the support disk and covers the side surface of the support disk, and a second surface that abuts against the chamfered portion of the support disk and covers the chamfered portion of the support disk.

According to the aspects described above, a wafer attaching surface of a support disk is able to be inhibited from being etched.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
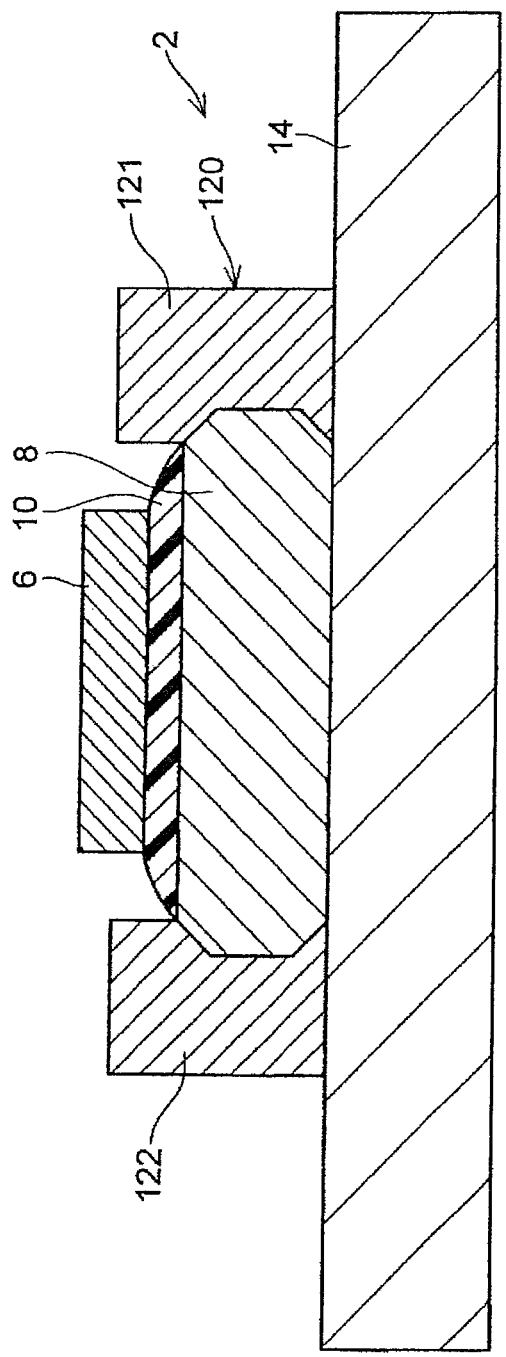
FIG. 1 is a sectional view of a jig according to one example embodiment of the invention.

Hereinafter, a manufacturing method for a semiconductor device using a jig 2 will be described. In this manufacturing method, a support disk 8 is fixed using the jig 2. Then, a wafer bonded body (6, 8, 10) is manufactured by bonding a wafer 6 to the support disk 8 with adhesive 10. This wafer bonded body (6, 8, 10) is then etched to reduce the thickness of the wafer 6.

Figure 7:
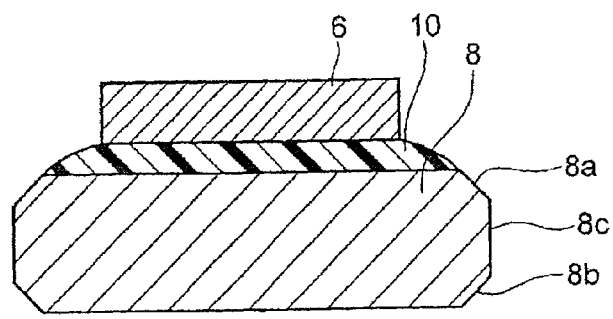
FIG. 7 is a sectional view of a state in which the wafer is bonded to the support disk.

First, the wafer bonded body (6, 8, 10) will be described. The wafer bonded body (6, 8, 10) is manufactured by the wafer 6 being bonded to the support disk 8 with the adhesive 10. As shown in FIG. 7, the wafer bonded body (6, 8, 10) includes the wafer 6, the support disk 8, and the adhesive 10 that bonds the wafer 6 to the support disk 8.

The wafer 6 is a semiconductor wafer. The wafer 6 is formed by a semiconductor of silicon (Si) or silicon carbide (SiC), for example.

The support disk 8 has an upper surface to which the wafer 6 is bonded, and a lower surface that abuts against a base 14 of the jig 2 when the support disk 8 is fixed to the base 14. The upper surface and the lower surface of the support disk 8 are flat surfaces. The support disk 8 has a cylindrical side surface 8c between the upper surface and the lower surface.

The support disk 8 is more rigid than the wafer 6. Therefore, forming the wafer bonded body (6, 8, 10) facilitates the transfer and the like of the wafer 6 when manufacturing the semiconductor device by processing the wafer 6. Alkali-free glass, for example, may be used as the material of the support disk 8. The semiconductor device manufactured by processing the wafer 6 may be any kind of semiconductor device. That is, the semiconductor device manufactured by processing the wafer 6 may be a MOSFET or an IGBT, for example.

Also, the support disk 8 has a chamfered portion 8a formed between the upper surface and the side surface 8c. This chamfered portion 8a makes it possible to prevent a corner portion between the upper surface and the side surface 8c of the support disk 8 from becoming damaged. The support disk 8 also has a chamfered portion 8b between the lower surface and the side surface 8c. This chamfered portion 8b makes it possible to prevent a corner portion between the lower surface and the side surface 8c of the support disk 8 from becoming damaged. That is, the support disk 8 is formed in a circular cylindrical shape, and has the chamfered portions 8a and 8b between the top and bottom surfaces, and the side surface (i.e., the chamfered portion 8a between the top surface and the side surface 8c, and the chamfered portion 8b between the bottom surface and the side surface 8c).

Figure 2:
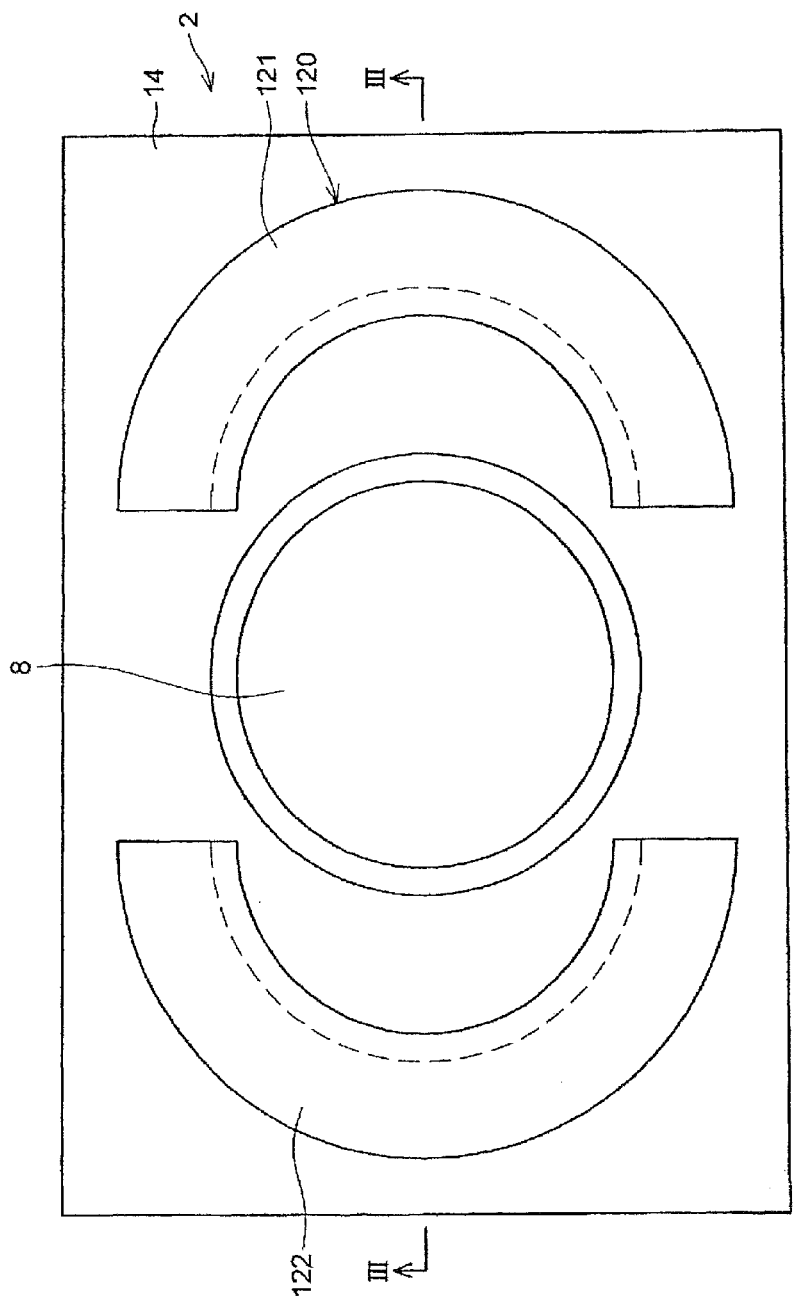
FIG. 2 is a plan view of a state in which a fixture of the invention is open and a support disk is placed on a base.

Next, the jig 2 will be described. As shown in FIGS. 1 and 2, the jig 2 includes the base 14 and a fixture 120. The base 14 has an upper surface on which the support disk 8 and the fixture 120 are placed.

The fixture 120 is arranged on the upper surface of the base 14. The fixture 120 includes a right fixture 121 and a left fixture 122. A surface on the left side of the right fixture 121 (i.e., the surface that abuts against the support disk 8) is arc-shaped following the shape of the outer peripheral surface of the support disk 8 (FIG. 2). Also, a surface on the right side of the left fixture 122 (i.e., the surface that abuts against the support disk 8) is similarly arc-shaped following the shape of the outer peripheral surface of the support disk 8 (FIG. 2).

Figure 3:
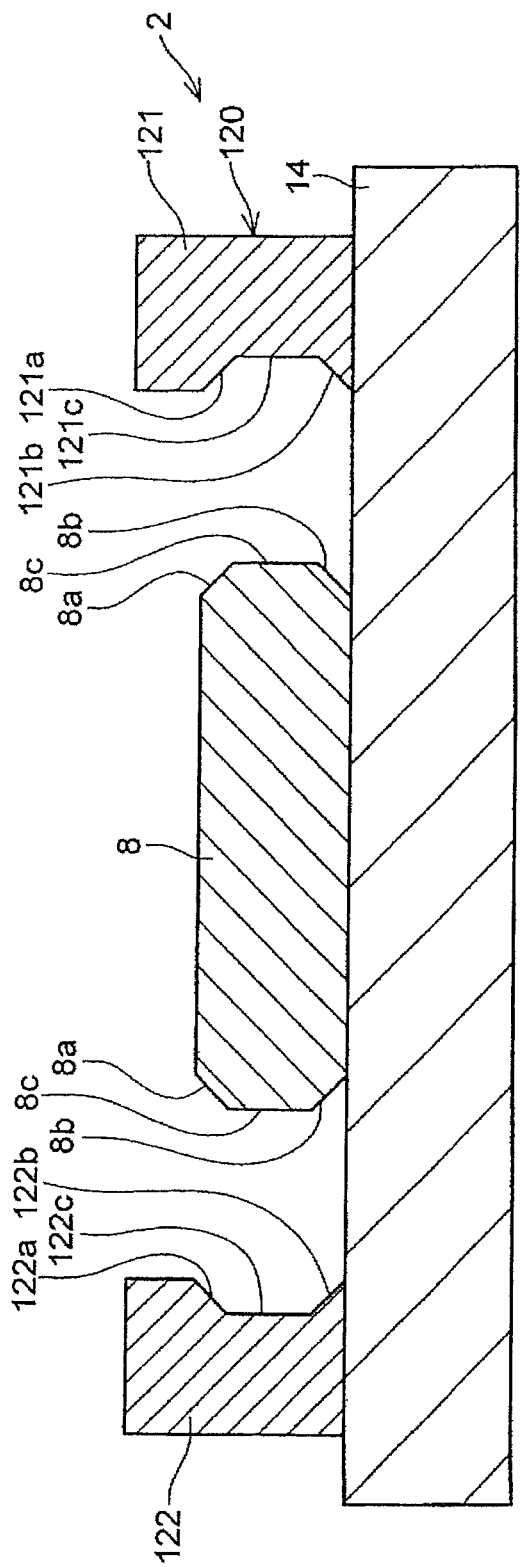
FIG. 3 is a sectional view taken along a cross-section (III-III) in FIG. 2.
Figure 4:
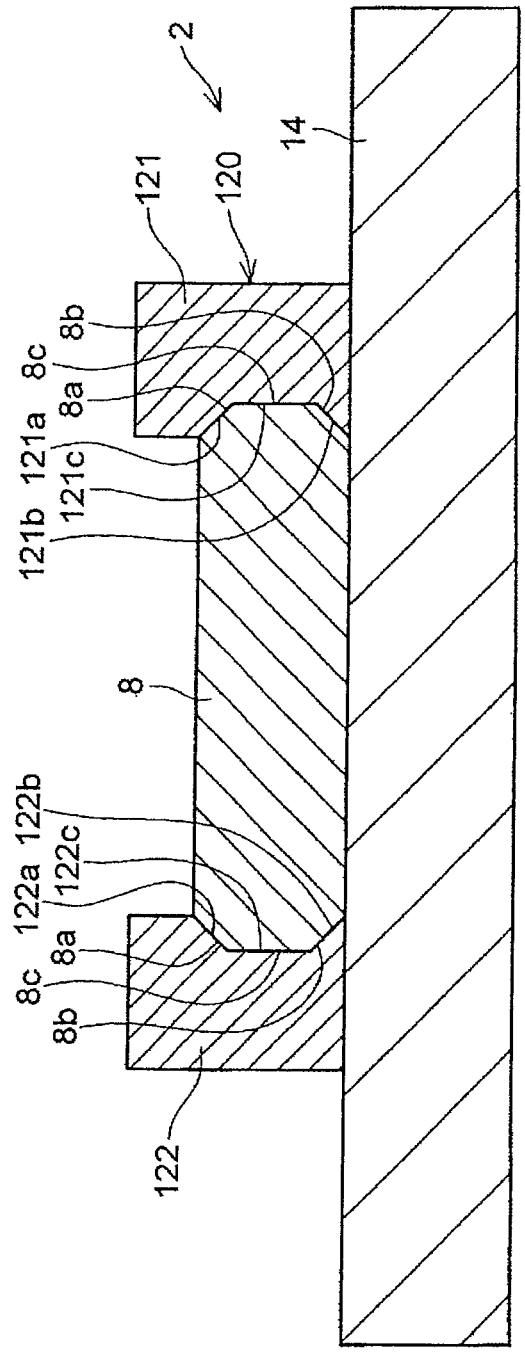
FIG. 4 is a sectional view of a state in which the fixture is closed and the support disk is fixed to the base.

As shown in FIG. 3, a first surface 121c positioned in the center in the vertical direction, a second surface 121a positioned above the first surface, and a third surface 121b positioned below the first surface are all formed on a side surface on the left side (the inside of the arc) of the right fixture 121. As shown in FIG. 3, the first surface 121c, the second surface 121a, and the third surface 121b form a shape that is recessed toward the right side of the right fixture 121. As shown in FIG. 4, when the support disk 8 is fixed to the base 14, the first surface 121c, the second surface 121a, and the third surface 121b of the right fixture 121 abut against the side surface 8c, the chamfered portion 8a, and the chamfered portion 8b, respectively, on the right side of the support disk 8 (this will be described in detail later).

Similarly, a first surface 122c positioned in the center in the vertical direction, a second surface 122a positioned above the first surface, and a third surface 122b positioned below the first surface are all formed on a side surface on the right side (the inside of the arc) of the left fixture 122. As shown in FIG. 3, the first surface 122c, the second surface 122a, and the third surface 122b form a shape that is recessed toward the left side of the left fixture 122. As shown in FIG. 4, when the support disk 8 is fixed to the base 14, the first surface 122c, the second surface 122a, and the third surface 122b of the left fixture 122 abut against the side surface 8c, the chamfered portion 8a, and the chamfered portion 8b, respectively, on the left side of the support disk 8 (this will be described in detail later).

A conventionally well-known electric slide mechanism, not shown, is provided both between the base 14 and the right fixture 121, and between the base 14 and the left fixture 122. The right fixture 121 is able to move relative to the base 14 in the left-right (lateral) direction. Also, the left fixture 122 is also able to move relative to the base 14 in the left-right (lateral) direction. That is, the base 14 is provided below the support disk 8, and movably retains the fixtures 121 and 122.

Next, a manufacturing method for the semiconductor device according to this example embodiment will be described with reference to the flowchart in FIG. 8. In step S2, the support disk 8 is fixed to the base 14. More specifically, first, the right fixture 121 and the left fixture 122 are slid apart (i.e., away from each other). Then the support disk 8 is placed on the upper surface of the base 14 (FIGS. 2 and 3).

Next, the left and right fixtures 121 and 122 are slid together (i.e., toward each other). That is, the right fixture 121 is slid toward the left, and the left fixture 122 is slid toward the right. The first surface 121c of the right fixture 121 abuts against the side surface 8c of the support disk 8, covering the side surface 8c. Also, the second surface 121a of the right fixture 121 abuts against the upper chamfered portion 8a, covering the upper chamfered portion 8a. Further, the third surface 121b of the right fixture 121 abuts against the lower chamfered portion 8b, covering the lower chamfered portion 8b.

Also, the first surface 122c of the left fixture 122 abuts against the side surface 8c of the support disk 8, covering the side surface 8c. The second surface 122a of the left fixture 122 abuts against the upper chamfered portion 8a, covering the upper chamfered portion 8a. The third surface 122b of the left fixture 122 abuts against the lower chamfered portion 8b, covering the lower chamfered portion 8b.

The support disk 8 is fixed horizontally on the upper surface of the base 14 by the first surfaces 121c and 122c of the fixtures 121 and 122 abutting against the side surface 8c of the support disk 8. Also, the support disk 8 is pushed toward the base 14 (i.e., downward) by the second surfaces 121a and 122a of the left and right fixtures 121 and 122 abutting against the upper chamfered portion 8a of the support disk 8. As a result, the lower surface of the support disk 8 closely contacts the upper surface of the base 14. The third surfaces 121b and 122b abut against the lower chamfered portion 8b of the support disk 8. The support disk 8 is fixed to the base 14 by these processes.

Figure 5:
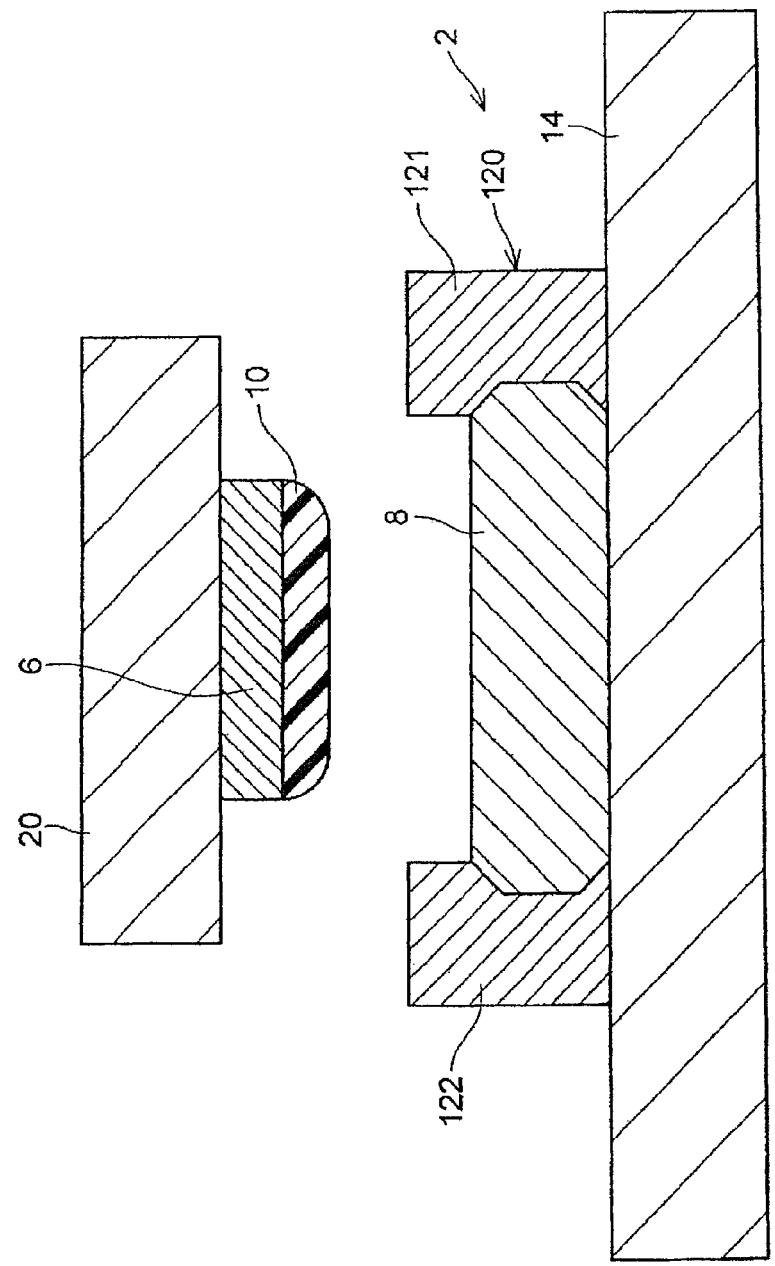
FIG. 5 is a sectional view of a state in which a wafer to which an adhesive has been applied is arranged above the support disk.
Figure 8:
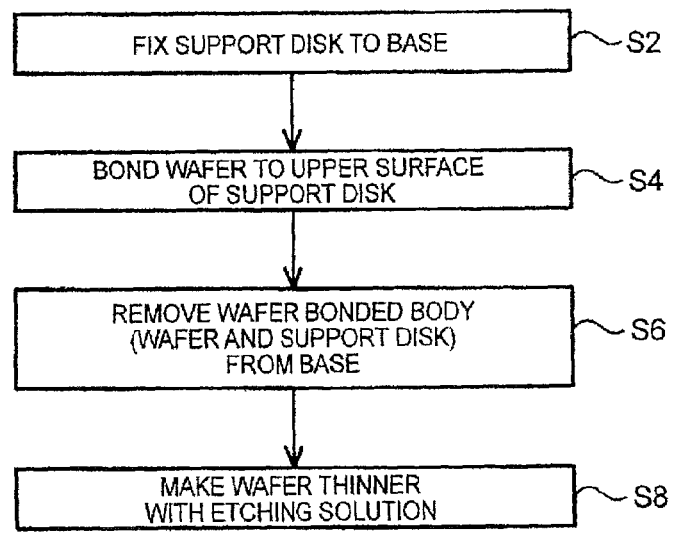
FIG. 8 is a flowchart illustrating a method for manufacturing a semiconductor device using the jig according to the example embodiment of the invention.

Next, in step S4, the wafer 6 is bonded to the upper surface of the support disk 8 (FIG. 8). First, as shown in FIG. 5, the wafer 6 is arranged above the support disk 8. A conventionally well-known suction transfer device, for example, is used to handle the wafer 6. The adhesive 10 is applied to the lower surface of the wafer 6. An adhesive that includes a polyimide, for example, may be used as the adhesive 10. At this time, the temperatures of the wafer 6 and the adhesive 10 are made temperatures that are higher than the curing temperature of the adhesive. Therefore, the adhesive 10 applied to the lower surface of the wafer 6 remains in an uncured state.

Next, the wafer 6 that has been placed above the support disk 8 is moved downward. As will be described later, an outer diameter of the upper surface of the support disk 8 is slightly larger than an outer diameter of the wafer 6. The wafer 6 is arranged such that the outer diameter of the wafer 6 falls within the outer diameter of the upper surface of the support disk 8. As a result, an outer peripheral edge portion of the wafer 6 is able to be prevented from protruding out from the upper surface of the support disk 8 when the wafer 6 is arranged on the upper surface of the support disk 8.

Figure 6:
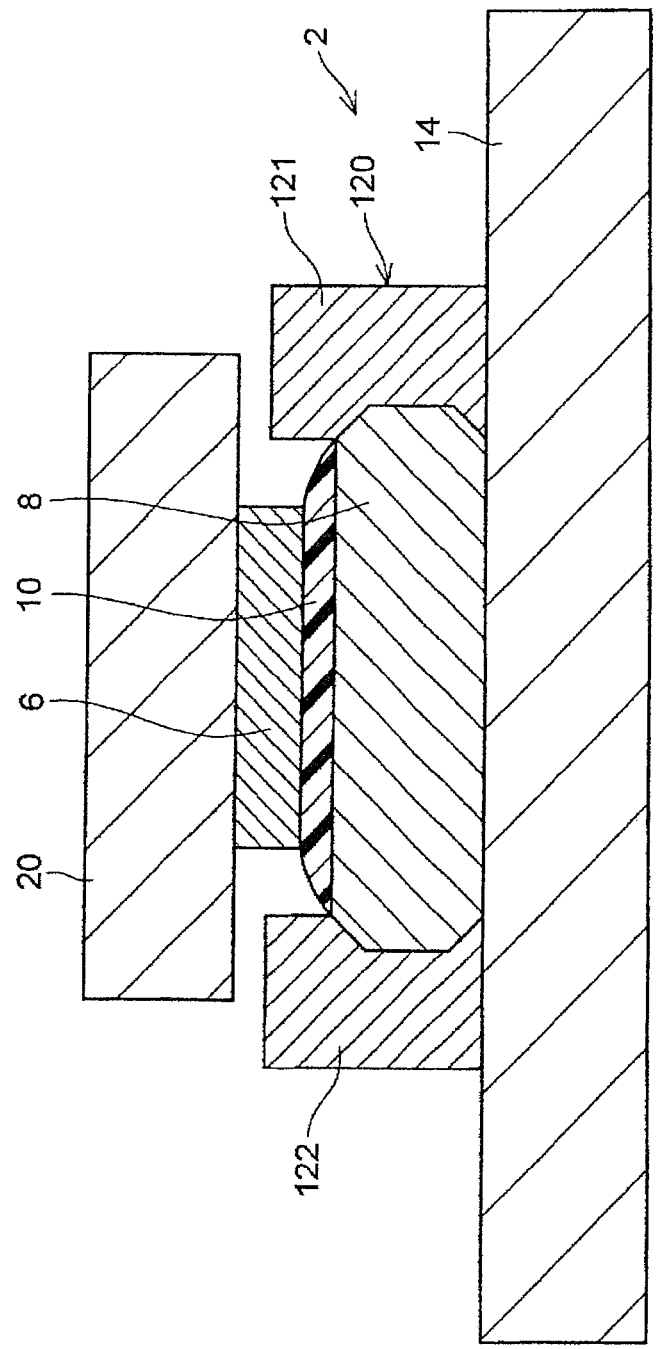
FIG. 6 is a sectional view of a state in which the wafer to which the adhesive has been applied is crimped to the support disk.

Continuing on, the wafer 6 is crimped to the support disk 8. That is, the wafer 6 is pushed toward the support disk 8 (FIG. 6). Because the wafer 6 is pushed toward the support disk 8, the adhesive 10 overflows from the gap between the wafer 6 and the support disk 8. The adhesive 10 spreads over the entire upper surface of the support disk 8.

Next, the wafer bonded body (6, 8, 10) is cooled naturally while keeping the wafer 6 crimped to the upper surface of the support disk 8. The adhesive 10 cures (hardens) gradually as the temperature of the adhesive 10 drops. After the adhesive 10 has cured to some degree, the suction transfer device 20 is moved away from the wafer 6. Because the adhesive 10 is curing, the wafer 6 will remain bonded to the upper surface of the support disk 8 even if the suction transfer device 20 is moved away (FIG. 1). However, at this time, the adhesive 10 is not completely cured (this will be described in detail later).

With the jig 2 in this example embodiment, in a state in which the support disk 8 is fixed to the base 14, the side surface 8c of the support disk 8 is covered by the first surfaces 121c and 122c of the fixture 120. Also, the chamfered portion 8a of the support disk 8 is covered by the second surfaces 121a and 122a of the fixture 120. Therefore, with the jig 2 of this example embodiment, the adhesive 10 is able to be inhibited from adhering to the side surface 8c and the chamfered portion 8a of the support disk 8 when the wafer 6 is bonded to the support disk 8.

In a state in which the wafer 6 is crimped to the upper surface of the support disk 8, a portion of the upper surface of the support disk 8 is covered by the wafer 6. Also, the portion of the upper surface of the support disk 8 that is not covered by the wafer 6 is covered by the adhesive 10. The fixture 120 that will be described later does not cover the upper surface of the support disk 8, so all of the portion of the upper surface of the support disk 8 that is not covered by the wafer 6 is covered by the adhesive 10. That is, the upper surface of the support disk 8 is covered by either the wafer 6 or the adhesive 10. The amount of the adhesive 10 applied to the wafer 6 is equal to or greater than the amount required for the upper surface of the support disk 8 to be covered by either the wafer 6 or the adhesive 10.

If the arc-shaped groove in JP 2012-49274 A was formed on the upper surface of the support disk 8, a portion of the upper surface of the support disk 8 to the outside of the groove would not be covered by the adhesive 10. However, with the jig 2 of this example embodiment, the adhesive 10 is able to be inhibited from adhering to the side surface 8c and the chamfered portion 8a of the support disk 8, so there is no need to provide the arc-shaped groove. Therefore, the entire upper surface of the support disk 8 is able to be covered by either the wafer 6 or the adhesive 10.

Also, with the jig 2 of this example embodiment, the fixture 120 does not cover the upper surface of the support disk 8. Therefore, the entire upper surface of the support disk 8 is able to be used for bonding the wafer 6. As a result, the outer diameter of the support disk 8 is able to be made smaller than it is in a case such as when a portion of the upper surface of the support disk 8 is covered by the fixture 120 or the like.

Next, in step S6, the wafer bonded body (6, 8, 10) is removed from the base 14 (FIGS. 8 and 7). First, the left and right fixtures 121 and 122 are slid away from the support disk 8. More specifically, the right fixture 121 is slid toward the right and the left fixture 122 is slid toward the left. Then the support disk 8 is removed from the upper surface of the base 14. The base 14 of the wafer bonded body (6, 8, 10) is removed by conventionally well-known transferring means.

At this time, the fixture 120 is moved away from the support disk 8 before the adhesive 10 completely is cured. Thus, the fixture 120 and the support disk 8 are prevented from becoming fixed by the adhesive 10.

The wafer bonded body (6, 8, 10) that has been removed from the base 14 is transferred to an etching apparatus, not shown. The wafer bonded body (6, 8, 10) is transferred from the base 14 to the etching apparatus by conventionally well-known transferring means.

Next, in step S8, the wafer 6 is etched (FIGS. 8 and 7). More specifically, wet etching is performed using etching solution. In the etching process, a conventionally well-known etching apparatus may be used. In the etching process, the etching solution is sprayed onto the upper surface of the wafer 6 while the wafer 6 is rotated around the axis of the wafer 6. The wafer 6 is rotated by rotating the wafer bonded body (6, 8, 10). Centrifugal force from the rotation is applied to the etching solution sprayed onto the upper surface of the wafer 6. Accordingly, the etching solution flows toward the radial outside of the wafer 6. As a result, the entire upper surface of the wafer 6 is etched, such that the thickness of the entire wafer 6 is reduced.

Moreover, some of the etching solution that has flowed on the upper surface of the wafer 6 toward the radial outside contacts the upper surface of the support disk 8 at a portion that is not covered by the wafer 6. Some of the etching solution may also be sprayed directly onto the upper surface of the support disk 8 at a portion that is not covered by the wafer 6.

As described above, if the jig 2 of this example embodiment is used, the entire upper surface of the support disk 8 is able to be covered by either the wafer 6 or the adhesive 10. Therefore, the etching solution is able to be inhibited from contacting the upper surface of the support disk 8 in the etching process. As a result, the upper surface of the support disk 8 is able to be inhibited from being etched in the etching process.

In the etching process described above, etching solution is sprayed from above the support disk 8. Also, the support disk 8 is rotated. Therefore, the amount of etching solution that contacts the side surface 8c and the upper and lower chamfered portions 8a and 8b of the support disk 8 is comparatively little.

Heretofore, specific examples of the invention have been described in detail, but these are merely examples, and the invention is not limited to these examples. Various modifications of the specific examples described above are also included in the technology described in the claims. Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A support disk fixing apparatus, comprising:
   a base upon which a support disk is placed, wherein the support disk comprises a flat upper surface to which a wafer is capable of being bonded, a flat lower surface, a cylindrical side surface between the upper surface and the lower surface, and a chamfered portion between the upper surface and the side surface; and
   a fixture that is provided on the base, wherein the fixture has a first surface that abuts against the side surface of the support disk and covers the side surface of the support disk, and a second surface that abuts against the chamfered portion of the support disk and covers the chamfered portion of the support disk.

2. A method for manufacturing a semiconductor device using the apparatus according to claim 1, comprising:
   fixing the support disk to the base by abutting the first surface of the fixture against the side surface of the support disk, and abutting the second surface of the fixture against the chamfered portion of the support disk;
   bonding a wafer to the upper surface of the support disk using an adhesive; and
   etching the wafer bonded to the support disk with an etching solution.

3. A semiconductor manufacturing apparatus comprising:
   a support disk formed in a circular cylindrical shape, the support disk having a flat lower surface and a chamfered portion that is formed between a flat top surface of the support disk and a side surface of the support disk; and
   a fixture that fixes the support disk, the fixture having a first surface that abuts against the side surface of the support disk and covers the side surface of the support disk, and a second surface that abuts against the chamfered portion of the support disk and covers the chamfered portion of the support disk.

4. The semiconductor manufacturing apparatus according to claim 3, further comprising:
   a base that is provided below the support disk and movably retains the fixture.

* * * * *